(12) United States Patent
Lee et al.

(10) Patent No.: US 7,105,870 B2
(45) Date of Patent: Sep. 12, 2006

(54) PHASE-CHANGEABLE MEMORY DEVICES

(75) Inventors: Su-Youn Lee, Gyeonggi-do (KR); Su-Jin Ahn, Seoul (KR); Chang-Wook Jeong, Seoul (KR)

(73) Assignee: Samsung Electronics Co., Ltd., (KR)

( * ) Notice: Subject to any disclaimer, the term of this patent is extended or adjusted under 35 U.S.C. 154(b) by 0 days.

(21) Appl. No.: 11/145,154

(22) Filed: Jun. 3, 2005

(65) Prior Publication Data
US 2005/0285094 A1    Dec. 29, 2005

(30) Foreign Application Priority Data
Jun. 29, 2004  (KR) ............... 10-2004-0049820

(51) Int. Cl.
*H01L 31/0328* (2006.01)
(52) U.S. Cl. .................. 257/200; 257/E45.002
(58) Field of Classification Search .............. 438/95; 257/42, 200, E45.002
See application file for complete search history.

(56) References Cited

U.S. PATENT DOCUMENTS

| | | | | |
|---|---|---|---|---|
| 4,646,266 A | * | 2/1987 | Ovshinsky et al. | 365/105 |
| 5,869,843 A | * | 2/1999 | Harshfield | 257/5 |
| 6,750,469 B1 | | 6/2004 | Ichihara et al. | |
| 6,781,145 B1 | * | 8/2004 | Doan et al. | 257/3 |
| 2003/0067013 A1 | * | 4/2003 | Ichihara et al. | 257/200 |
| 2003/0193053 A1 | | 10/2003 | Gilton | |
| 2005/0032307 A1 | * | 2/2005 | Karpov | 438/257 |

FOREIGN PATENT DOCUMENTS

JP    2002-246561    8/2002

\* cited by examiner

*Primary Examiner*—Matthew Smith
*Assistant Examiner*—Jarrett J. Stark
(74) *Attorney, Agent, or Firm*—Myers Bigel Sibley & Sajovec PA

(57) ABSTRACT

Phase-changeable memory devices include non-volatile memory cells. Each of these non-volatile memory cells may include a phase-changeable diode on a semiconductor substrate and a phase-changeable memory element having a first terminal electrically coupled to a terminal of the phase-changeable diode. This phase-changeable diode may include a lower electrode pattern on the semiconductor substrate, a first phase-changeable pattern on the lower electrode pattern and a gate switching layer pattern on the first phase-changeable pattern. The phase-changeable memory element includes a second phase-changeable pattern electrically coupled to the terminal of the phase-changeable diode and a memory switching layer pattern on the second phase-changeable pattern. The memory switching layer pattern may include a composite of a titanium layer pattern contacting the phase-changeable memory element and a titanium nitride layer pattern contacting the titanium layer pattern.

12 Claims, 13 Drawing Sheets

PHASE-CHANGEABLE MEMORY DEVICES

REFERENCE TO PRIORITY APPLICATION

This application claims priority to Korean Application Serial No. 2004-49820, filed Jun. 29, 2004, the disclosure of which is hereby incorporated herein by reference.

FIELD OF THE INVENTION

The present invention relates to non-volatile memory devices and methods of forming non-volatile memory devices and, more particularly, to memory devices having phase-changeable materials therein and methods of forming same.

BACKGROUND OF THE INVENTION

Conventional phase-changeable random access memories (PRAMs) may utilize a metal-oxide semiconductor (MOS) field effect transistor to control switching within a PRAM cell having a phase-changeable memory element therein. A phase-changeable memory element may utilize a phase-changeable material such as germanium-antimony-tellurium (GST), which is susceptible to phase changes in response to Joule heating. These phase changes enable the material to operate as a non-volatile storage medium for binary data. However, the use of a MOS field effect transistor within each PRAM cell may result in an unnecessarily large layout footprint for each cell and thereby reduce integration density of large PRAM arrays. The use of a MOS field effect transistor may also increase fabrication costs.

One example of a non-volatile phase changeable storage device is illustrated in U.S. Pat. No. 6,750,469 to Ichihara et al. Another non-volatile storage device is illustrated in U.S. Patent Publication No. 2003/0193053 to Gilton. This storage device may include a diode and a memory cell having chalcogenide glass therein. This chalcogenide glass may be formed as a germanium selenide layer.

SUMMARY OF THE INVENTION

Phase-changeable memory devices according to some embodiments of the invention include non-volatile memory cells. Each of these non-volatile memory cells may include a phase-changeable diode on a semiconductor substrate and a phase-changeable memory element having a first terminal electrically coupled to a terminal of the phase-changeable diode. This phase-changeable diode may include a lower electrode pattern on the semiconductor substrate, a first phase-changeable pattern on the lower electrode pattern and a gate switching layer pattern on the first phase-changeable pattern. The phase-changeable memory element includes a second phase-changeable pattern electrically coupled to the terminal of the phase-changeable diode and a memory switching layer pattern on the second phase-changeable pattern. The memory switching layer pattern may include a composite of a titanium layer pattern contacting the phase-changeable memory element and a titanium nitride layer pattern contacting the titanium layer pattern. The first phase-changeable pattern may be a material selected from the group consisting of $Ge_xAs_yTe_z$ and $Al_xAs_yTe_z$ and the second phase-changeable pattern may be a material selected from the group consisting of $Ge_xSb_yTe_z$.

Still further embodiments of the invention include methods of forming non-volatile memory devices and cells having phase-changeable diode and phase-changeable memory elements therein.

DESCRIPTION OF PREFERRED EMBODIMENTS

Figure 1:
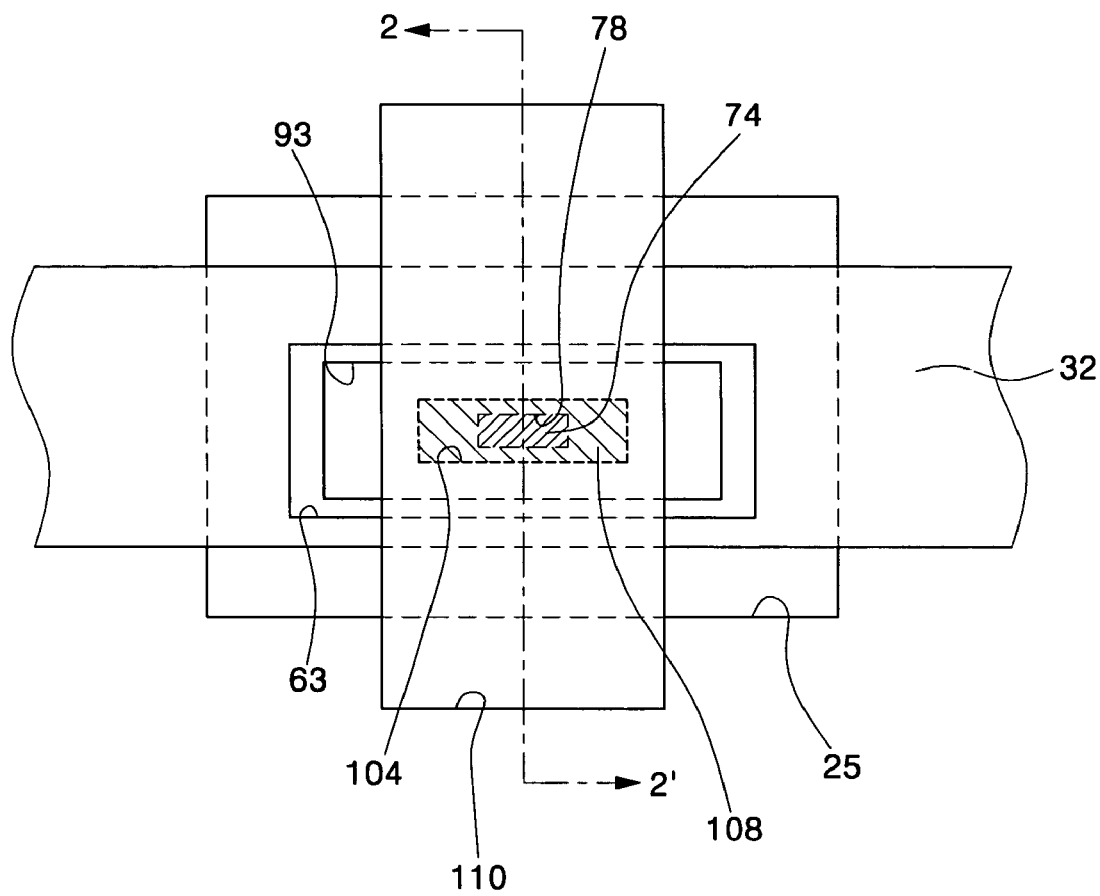
FIG. 1 is a layout view of a phase-changeable random access memory (PRAM) cell according to embodiments of the invention.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout.

Figure 2:
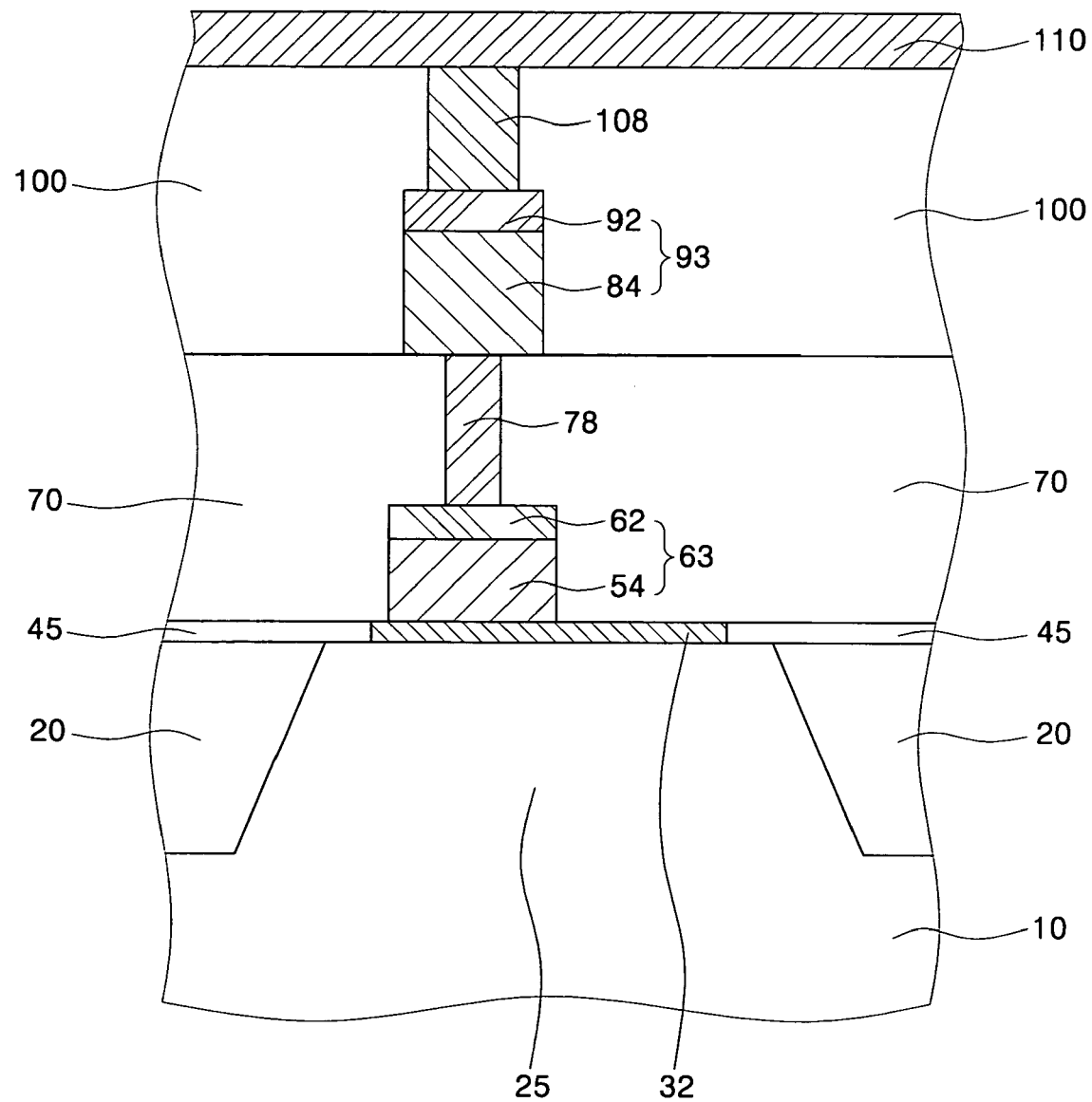
FIG. 2 is a cross-sectional view of the PRAM cell of FIG. 1, taken along line 2–2'.
Figure 3:
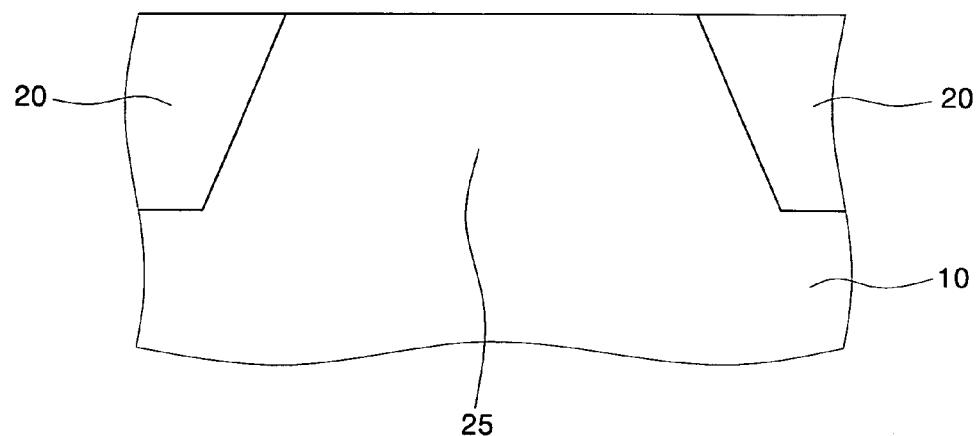
FIGS. 3–14 are cross-sectional views of intermediate structures that illustrate methods forming the PRAM cell of FIGS. 1–2, according to embodiments of the present invention.
Figure 4:
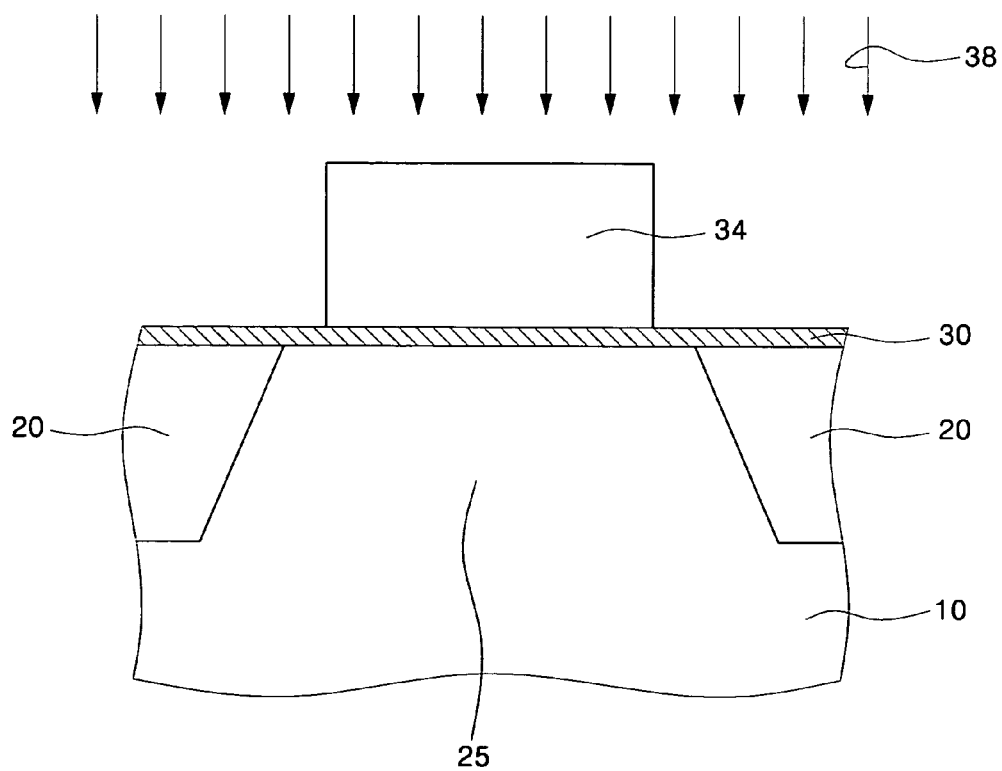
Figure 5:
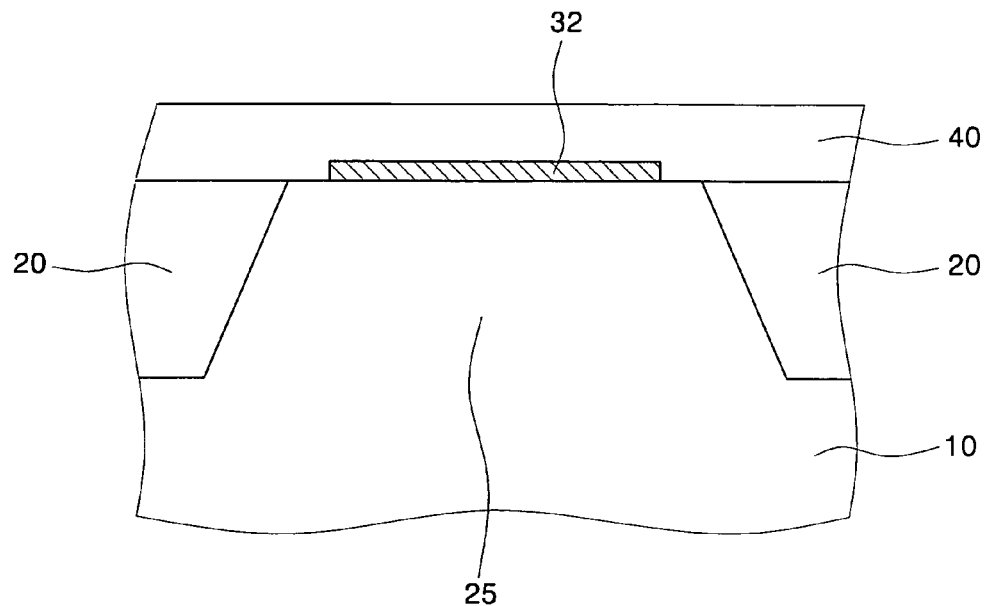
Figure 6:
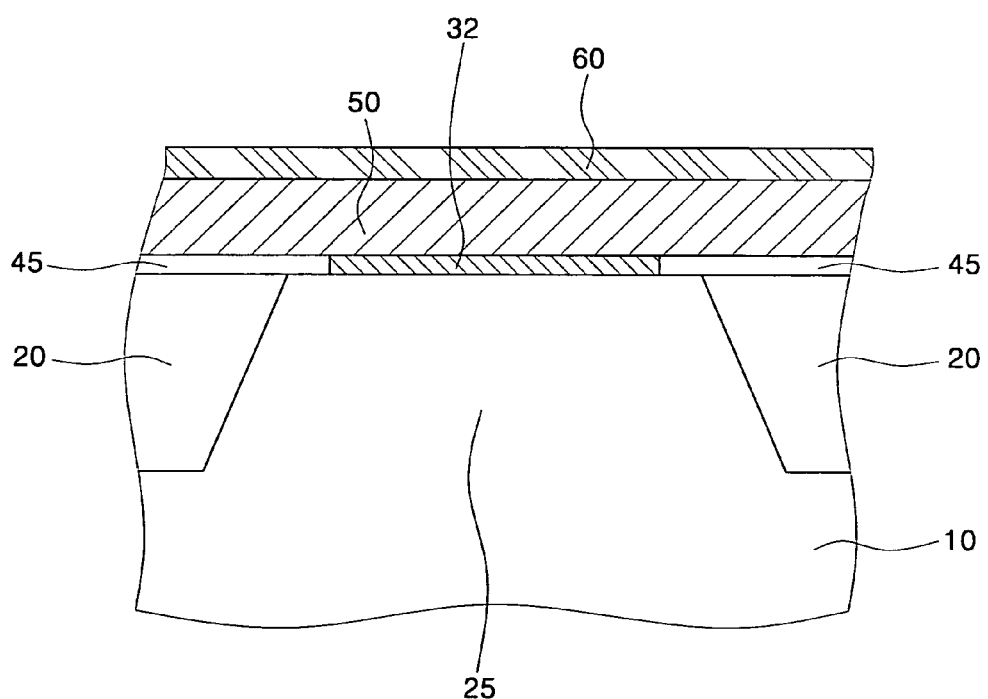
Figure 7:
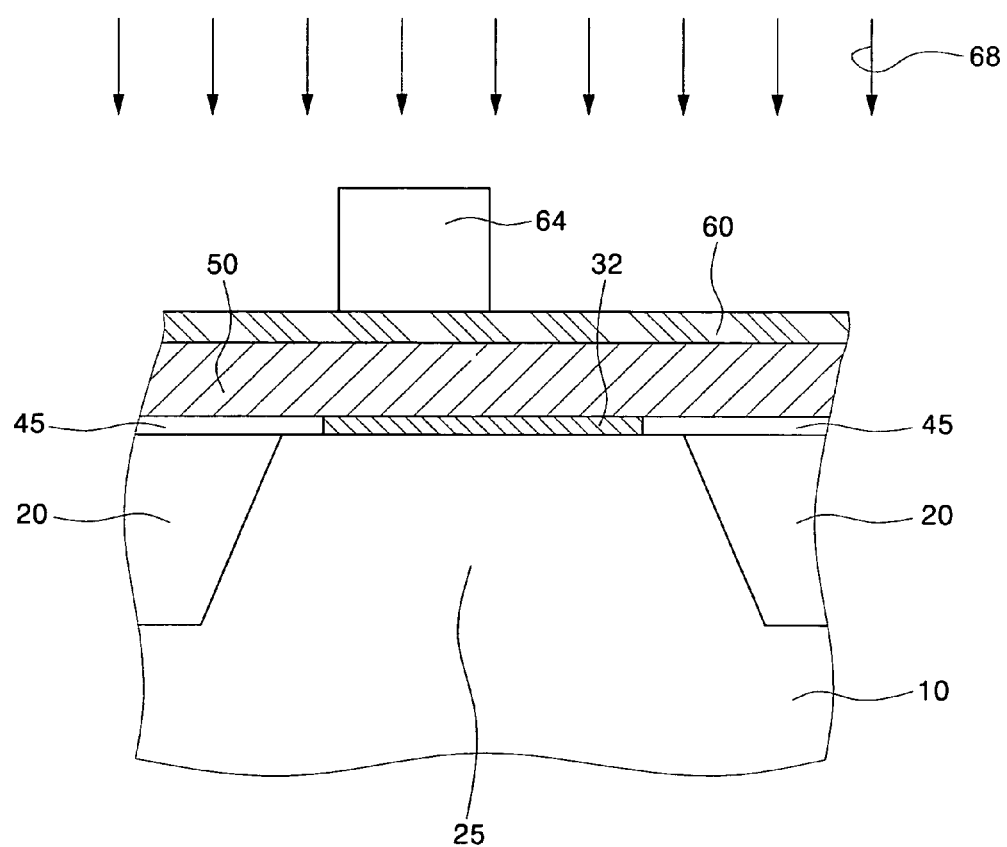
Figure 8:
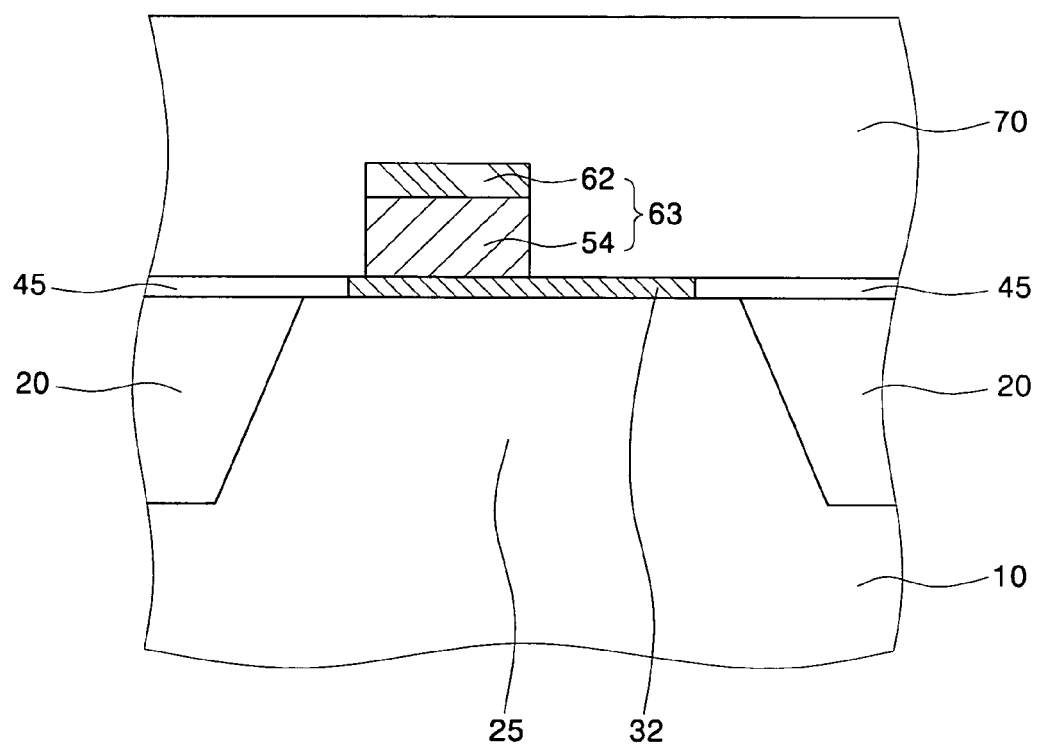

FIG. 1 is a layout view of a PRAM according to an embodiment of the invention, and FIG. 2 is a sectional view of a PRAM taken along line 2–2' of FIG. 1. Referring now to FIGS. 1 and 2, a device isolation layer 20 is disposed in a semiconductor substrate 10, while isolating at least one semiconductor active region 25. A lower electrode layer pattern 32 is disposed on the active region 25 of the semiconductor substrate 10. The lower electrode layer pattern 32 is disposed to traverse the active region 25. A pad layer pattern 45 is disposed on the semiconductor substrate 10. The pad layer pattern 45 may surround the lower electrode layer pattern 32. The pad layer pattern 45 can be disposed to contact sidewalls of the lower electrode layer pattern 32. The pad layer pattern 45 may be an electrically insulating layer having an etching ratio different from that of the device isolation layer 20. Alternatively, the pad layer pattern 45 may be an insulating layer having the same etching ratio as that of the device isolation layer 20. The pad layer pattern 45 may be a TEOS (tetra-ethyl-orthosilicate), or a HDP (high density plasma) oxide layer. The lower electrode layer pattern 32 may be formed as a titanium nitride (TiN) pattern. Alternatively, the lower electrode layer pattern 32 may be a tungsten (W) pattern.

A gate switching pattern 63 is disposed on the lower electrode layer pattern 32. The gate switching pattern 63 may include a gate phase-change layer pattern 54 and a gate switching layer pattern 62, which are sequentially stacked. The gate switching layer pattern 62 is preferably a titanium nitride (TiN) pattern. The gate phase-change layer pattern 54 can be a composite of germanium, arsenic and tellurium ($Ge_xAs_yTe_z$). Or, the gate phase-change layer pattern 54 can be a composite of aluminum, arsenic and tellurium ($Al_xAs_yTe_z$). The lower electrode layer pattern 32 has a greater width than that of the gate switching pattern 63, and is in contact with the main surface of the semiconductor substrate 10. Alternatively, a gate interlayer insulating layer (not shown) may be interposed between the lower electrode layer pattern 32 and the semiconductor substrate 10. In this case, the lower electrode layer pattern 32 has a greater width than that of the gate switching pattern 63, and is in contact with the gate interlayer insulating layer.

A buried interlayer insulating layer 70 is formed on the pad layer pattern 45 and the lower electrode layer pattern 32, while covering the gate switching pattern 63. A memory switching pattern 93 is disposed on the buried interlayer insulating layer 70. The memory switching pattern 93 preferably includes a memory phase-change layer pattern 84 and a memory switching layer pattern 92, which are sequentially stacked. A gate landing pad 78 is disposed in the buried interlayer insulating layer 70, to electrically connect the memory switching pattern 93 and the gate switching pattern 63. The gate landing pad 78 may be preferably a titanium nitride (TiN) layer. The memory switching layer pattern 92 preferably includes a titanium (Ti) pattern and a titanium nitride (TiN) pattern, which are sequentially stacked. The memory phase-change layer pattern 84 is preferably a composite of germanium, antimony and tellurium ($Ge_xSb_yTe_z$). The buried interlayer insulating layer 70 is preferably an electrically insulating layer having an etching ratio different from that of the pad layer pattern 45. Alternatively, the buried interlayer insulating layer 70 may be an insulating layer having the same etching ratio as that of the pad layer pattern 45. The buried interlayer insulating layer 70 may be a PEOX (plasma-enhanced oxide) layer.

A planarized interlayer insulating layer 100 is disposed on the buried interlayer insulating layer 70, while covering the memory switching pattern 93. An upper electrode layer pattern 110 is disposed on the planarized interlayer insulating layer 100. The upper electrode layer pattern 110 is disposed perpendicular to the lower electrode layer pattern 32. A memory landing pad 108 is disposed in the planarized interlayer insulating layer 100, while being in contact with the upper electrode layer pattern 110 and the memory switching pattern 93 concurrently. The memory landing pad 108 preferably includes a titanium nitride (TiN) layer and a tungsten (W) layer, which are sequentially stacked. The upper electrode layer pattern 110 is preferably an aluminum (Al) layer or a copper (Cu) layer, for example. The planarized interlayer insulating layer 100 is preferably an insulating layer having the same etching ratio as that of the buried interlayer insulating layer 70. Or, the planarized interlayer insulating layer 100 may be an insulating layer having an etching ratio different from that of the buried interlayer insulating layer 70. The planarized interlayer insulating layer 100 may be a TEOS layer or a USG (undoped silicate glass) layer.

Now, hereinafter, a method of forming a PRAM having a gate phase-change layer pattern according to the invention will be described as follows. FIGS. 3 through 14 are sectional views illustrating a method of forming a PRAM taken along line I–I' of FIG. 1, respectively. Referring to FIG. 1 and FIGS. 3 through 5, a device isolation layer 20 is formed in a semiconductor substrate 10. The device isolation layer 20 is formed to isolate at least one active region 25. A lower electrode layer 30 is formed on the semiconductor substrate having the device isolation layer 20 therein. The lower electrode layer 30 is preferably formed by using a titanium nitride (TiN) layer. The lower electrode layer 30 may also be formed as a tungsten (W) layer.

Then, a photoresist pattern 34 is formed on the lower electrode layer 30. The photoresist pattern 34 is formed on the active region 25 of the semiconductor substrate 10. By using the photoresist pattern 34 as an etching mask, an etching process 38 can be performed on the lower electrode layer 30. The etching process 38 forms a lower electrode layer pattern 32 on the active region 25 of the semiconductor substrate 10. The lower electrode layer pattern 32 is formed to traverse the active region 25.

A pad layer 40 is formed to cover the lower electrode layer pattern 32. The pad layer 40 is preferably formed by using an electrically insulating layer having the same etching ratio as that of the device isolation layer 20. Or, the pad layer 40 may be formed by using an insulating layer having an etching ratio different from that of the device isolation layer 20. The pad layer 40 may be formed by using a TEOS (tetra-ethyl-orghosilicate) or a HDP (high density plasma) process.

Referring to FIG. 1 and FIGS. 6 through 8, By using the lower electrode layer pattern 32 as an etching buffer layer, a planarization process (not shown) is performed on the pad layer 40. The planarization process is performed until the upper surface of the lower electrode layer pattern 32 is exposed, thereby forming a pad layer pattern 45. The planarization process can be performed by using CMP (chemical mechanical polishing) or an etching-back technique.

A gate phase-change layer 50 and a gate switching layer 60 are sequentially formed on the semiconductor substrate having the pad layer pattern 45. The gate switching layer 60 is formed as a titanium nitride (TiN) layer. The gate phase-change layer 50 is preferably formed using a composite of germanium, arsenic and tellurium ($Ge_xAs_yTe_z$). Alternatively, the gate phase-change layer 50 may be formed using a composite of aluminum, arsenic and tellurium ($Al_xAs_yTe_z$).

Then, a photoresist pattern 64 is formed on the gate switching layer 60. The photoresist pattern 64 is formed to be disposed above the lower electrode layer pattern 32. By using the photoresist pattern 64 as an etching mask, an etching process 68 is sequentially performed on the gate switching layer 60 and the gate phase-change layer 50. The etching process 68 forms a gate switching pattern 63 on a predetermined region of the lower electrode layer pattern 32. The gate switching pattern 63 is preferably formed using a gate phase-change layer pattern 54 and a gate switching layer pattern 62, which are sequentially stacked. The gate switching pattern 63 can secure a switching characteristic of a diode by using a phase-change of the gate phase-change layer pattern 54. Therefore, the gate switching pattern 63 can replace a CMOS transistor. Further, the gate switching pattern 63 can simplify semiconductor fabrication processes of a PRAM.

A buried interlayer insulating layer 70 is formed to cover the gate switching pattern 63. The buried interlayer insulating layer 70 is preferably formed using an insulating layer having an etching ratio different from that of the pad layer 40. The buried interlayer insulating layer 70 may be formed by using an insulating layer having the same etching ratio as that of the pad layer 40. The buried interlayer insulating layer 70 may be formed using a PEOX (plasma-enhanced oxide) process.

Figure 9:
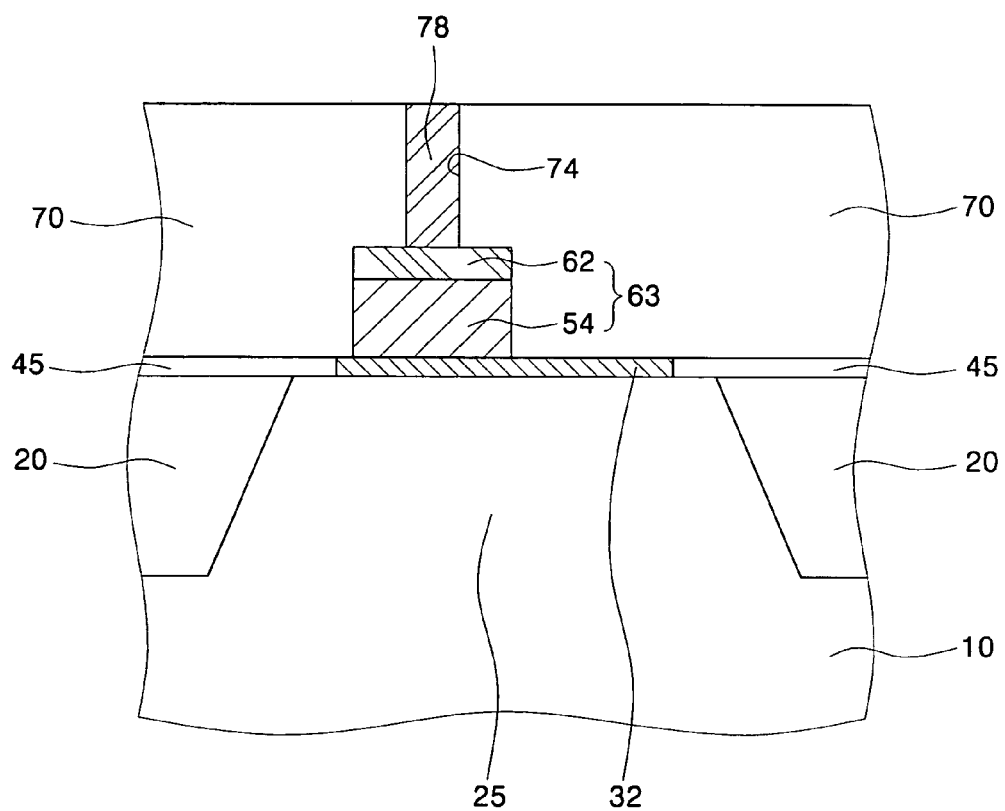
Figure 10:
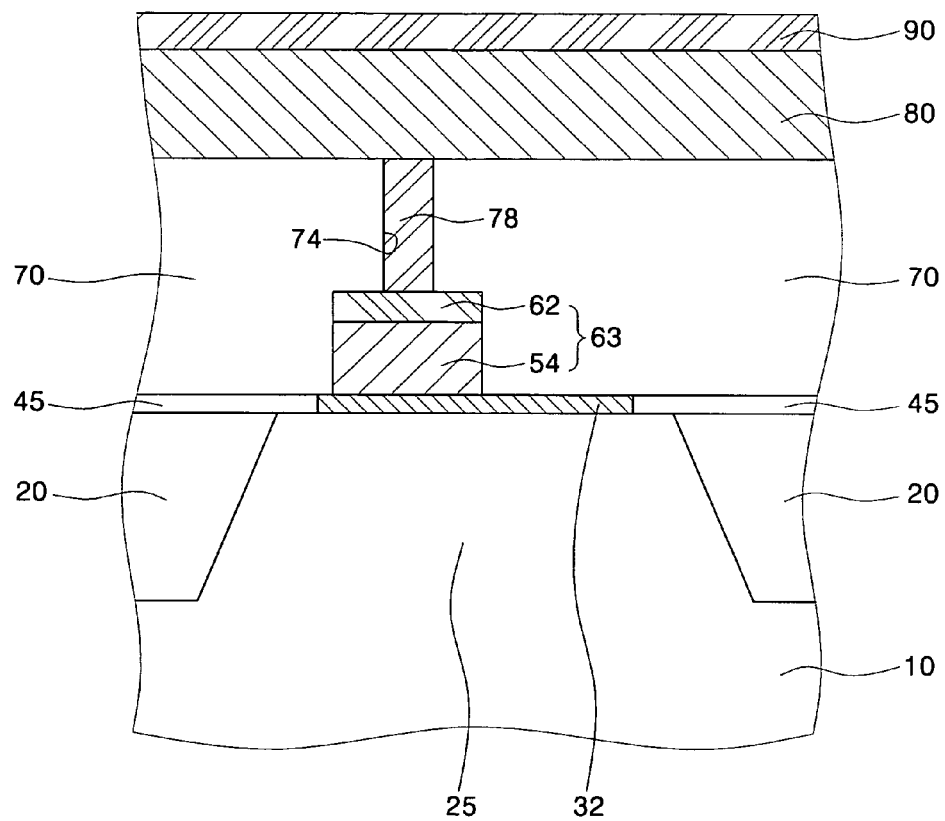
Figure 11:
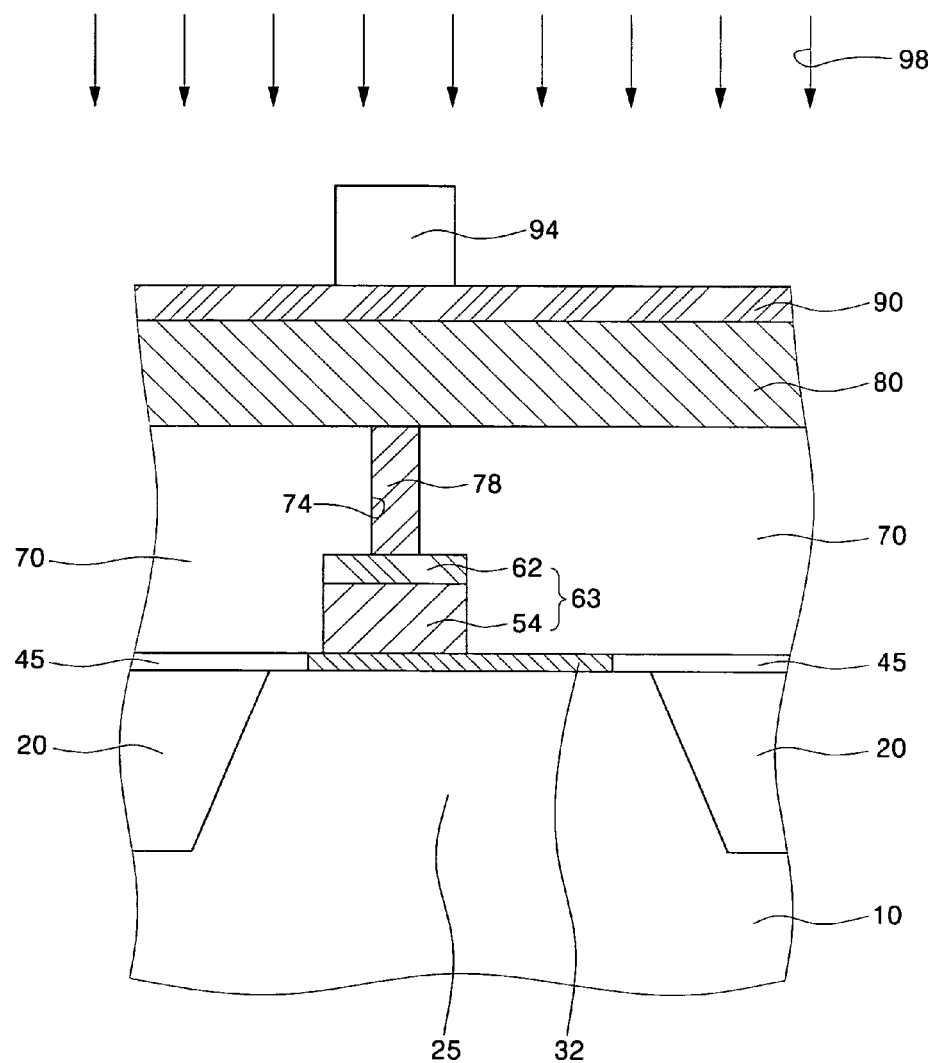
Figure 12:
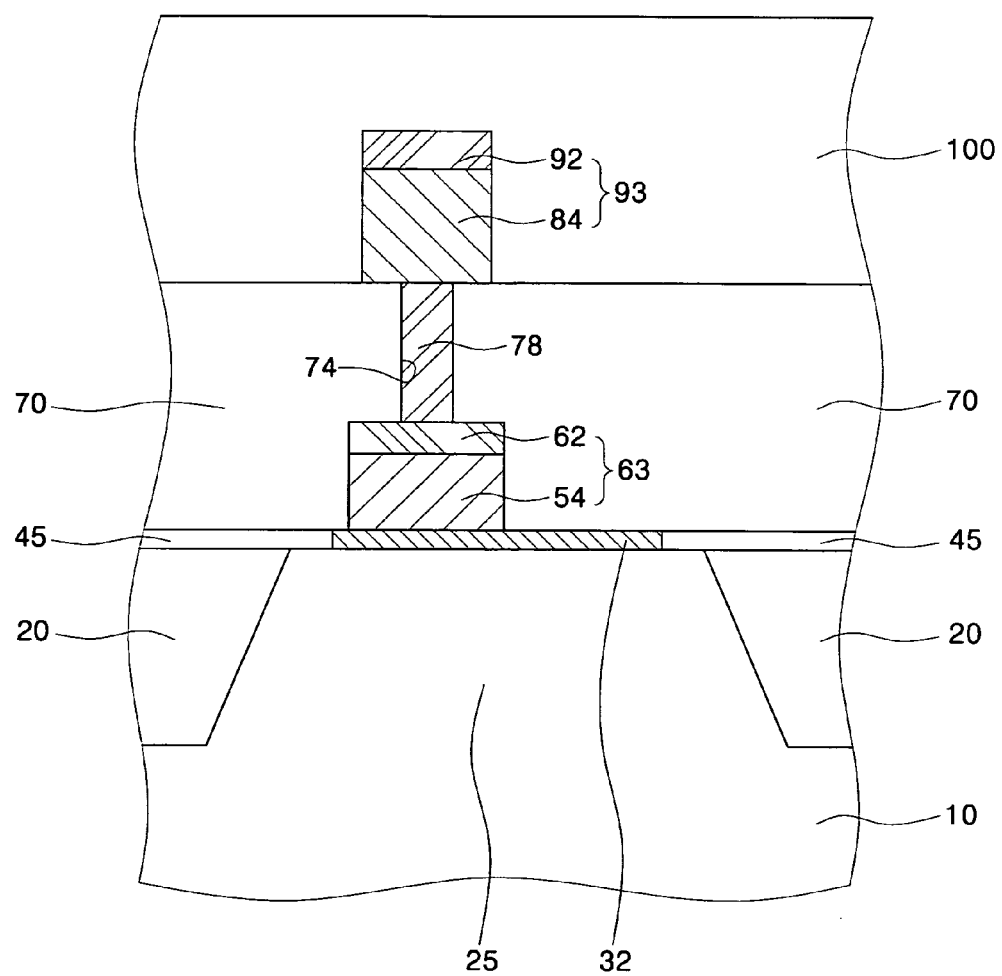
Figure 13:
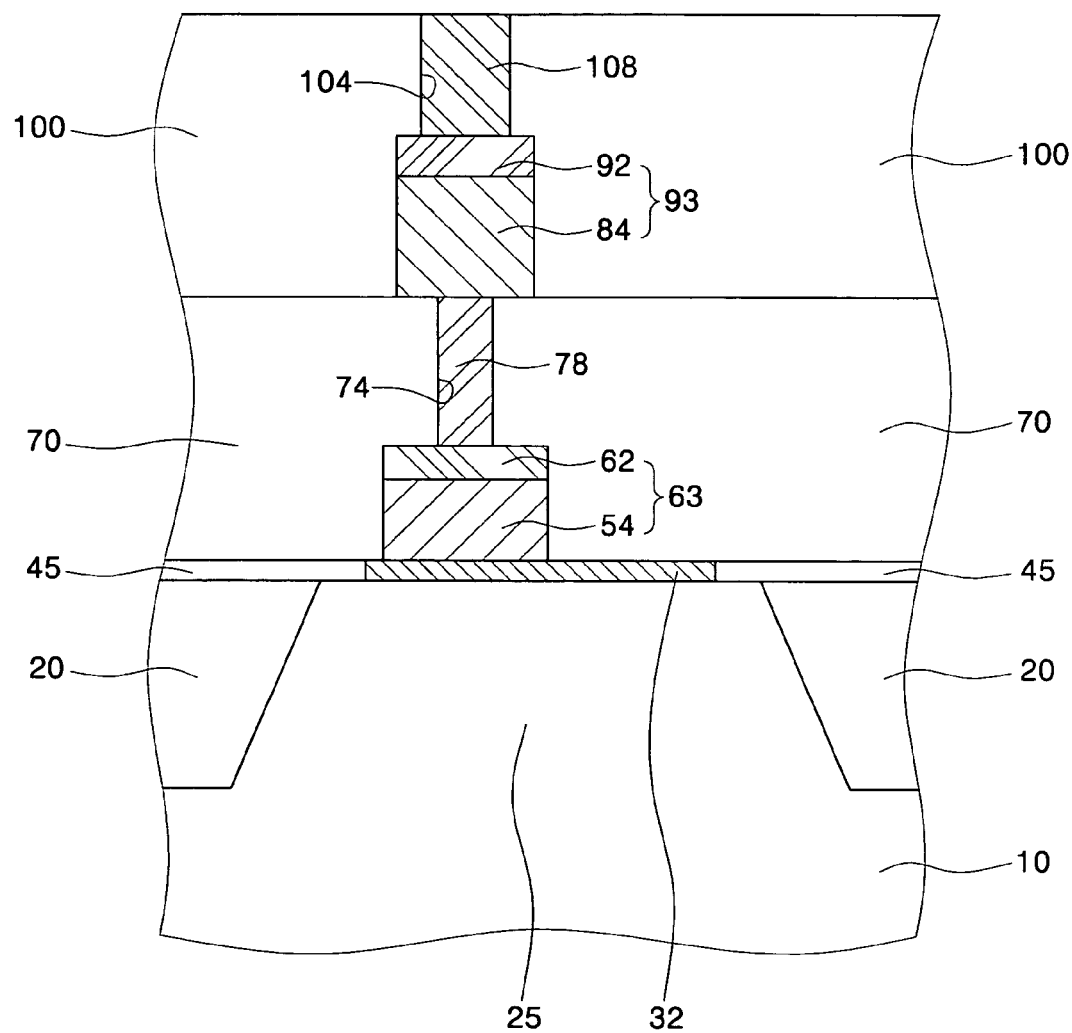

Referring to FIG. 1 and FIGS. 9 and 10, a gate switching contact hole 74 is formed in the buried interlayer insulating layer 70. The gate switching contact hole 74 is formed to expose the gate switching pattern 63. A gate landing pad 78 is formed to fill the gate switching contact hole 74. The gate landing pad 78 is preferably formed as a titanium nitride (TiN) pad.

Then, a memory phase-change layer 80 and a memory switching layer 90 are sequentially formed on the buried interlayer insulating layer 70. The memory switching layer 90 is preferably formed as a composite of a titanium (Ti) layer and a titanium nitride (TiN) layer, which are sequentially stacked. The memory phase-change layer 80 is preferably formed using a composite of germanium, antimony and tellurium ($Ge_xSb_yTe_z$).

Referring to FIG. 1 and FIGS. 11 through 14, a photoresist pattern 94 is formed on the memory switching layer 90. The photoresist pattern 94 is preferably formed to overlap the gate switching pattern 63 above the semiconductor substrate 10. By using the photoresist pattern 94 as an etching mask, an etching process 98 is sequentially performed on the memory switching layer 90 and the memory phase-change layer 80. The etching process 98 forms a memory switching pattern 93 on the buried interlayer insulating layer 70, being in contact with the gate landing pad 78. The memory switching pattern 93 is preferably formed using a memory phase-change layer pattern 84 and a memory switching layer pattern 92, which are sequentially stacked.

A planarized interlayer insulating layer 100 is formed to cover the memory switching pattern 93. A memory switching contact hole 104 is formed in the planarized interlayer insulating layer 100. The memory switching contact hole 104 is formed to expose the memory switching pattern 93. A memory landing pad 108 is formed to fill the memory switching contact hole 104. The memory landing pad 108 is preferably formed by using a titanium nitride (TiN) layer and a tungsten (W) layer, which are sequentially stacked. The planarized interlayer insulating layer 100 is preferably formed by using an insulating layer having an etching ratio different from that of the buried interlayer insulating layer 70. Or, the planarized interlayer insulating layer 100 may be formed by using an insulating layer having the same etching ratio as that of the buried interlayer insulating layer 70. The planarized interlayer insulating layer 100 may be formed by using a TEOS or a USG (undoped silicate glass) process.

An upper electrode layer pattern 110 is formed on the planarized interlayer insulating layer 100. The upper electrode layer pattern 110 is in contact with the memory landing pad 108. The upper electrode layer pattern 110 is formed to be disposed perpendicular to the lower electrode layer pattern 32. The upper electrode layer pattern 110 is preferably formed by using an aluminum (Al) or a copper (Cu).

Figure 14:
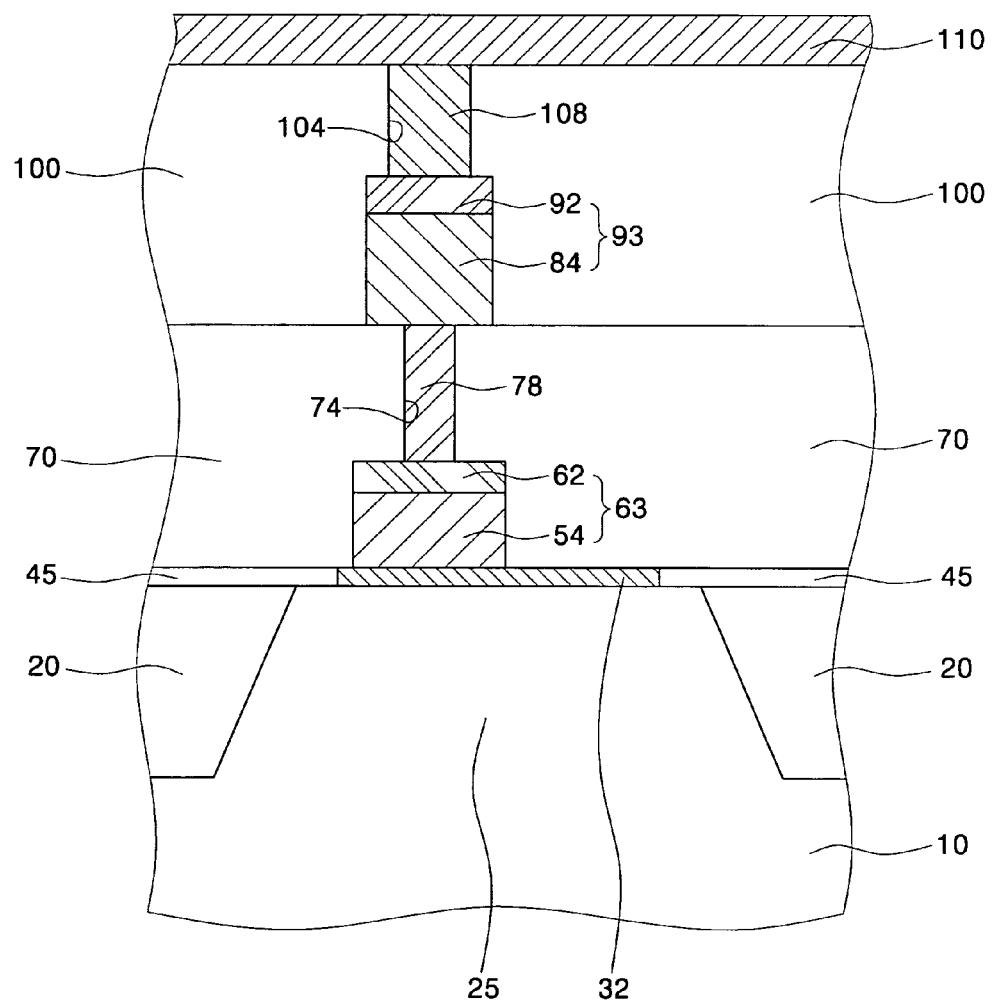
Figure 15:
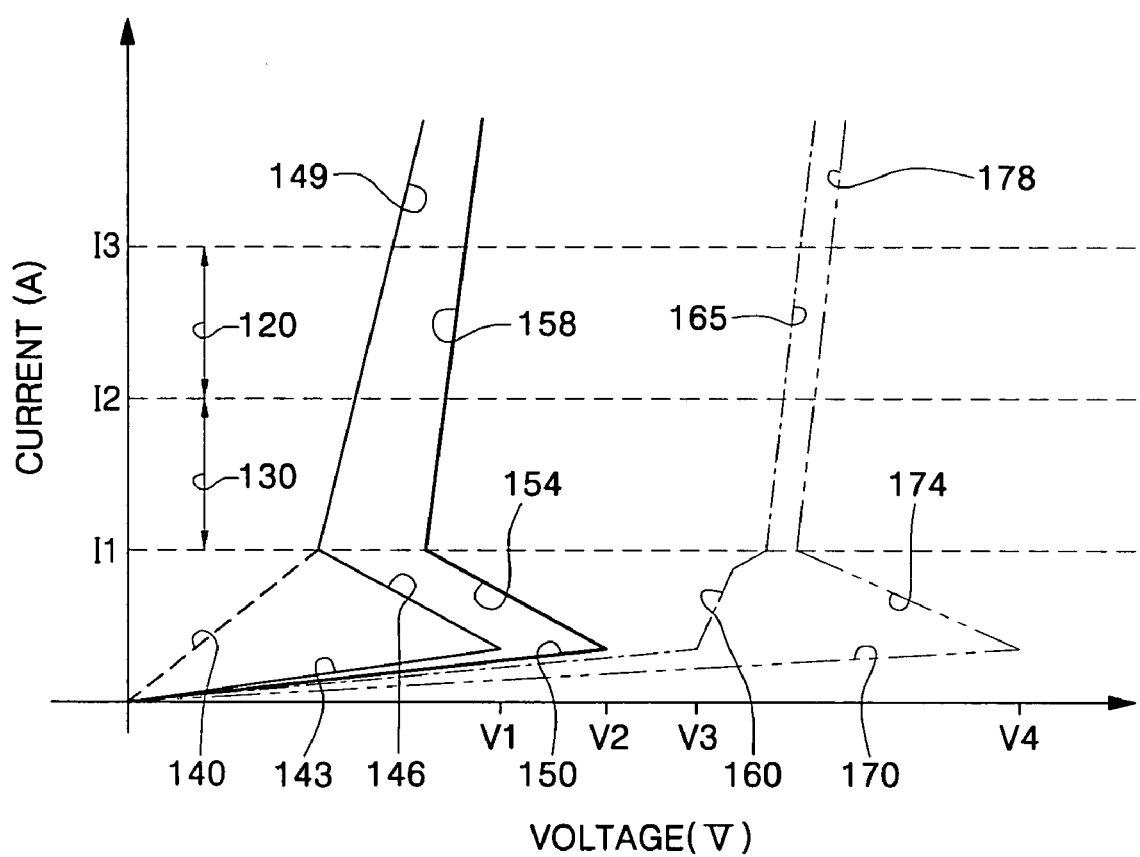
FIG. 15 is a current versus voltage graph illustrating characteristics of phase-changeable materials according to embodiments of the present invention.

FIG. 15 is a graph illustrating an operation of a PRAM of FIG. 1. Referring to FIG. 1 and FIGS. 14 and 15, in the case that the gate switching pattern 63 and the memory switching pattern 93 are not connected to each other and are used independently, electrical characteristics of the gate switching pattern 63 and the memory switching pattern 93 are shown as follows. First, there will be examined a current characteristic of the memory switching pattern 93 by using a current-voltage graph. In the current-voltage graph, a voltage is applied to the memory switching pattern 93. The memory switching pattern 93 shows an amorphous state having a high resistance depicted as a current trajectory line 143 until reaching a specific voltage V1 in the graph. Then, the memory switching pattern 93 causes the memory phase-change layer pattern 84 to make a phase change from an amorphous state to a crystalline state by using Joule heat of current at the specific voltage V1. The memory switching pattern 93 shows different current trajectory lines 146, 149 in the graph because of a decrease of inner resistance through the phase change of the memory phase-change layer pattern 84. Current trajectory lines 146 shows a change of currents upward to a lower limit value I1 of a setting region 130 with the start of the phase change of the memory phase-change layer pattern 84. The current trajectory line 149 vertically traverses the resetting and setting regions 120, 130 with nearly little change of current above the lower limit value I1 of the setting region 130, which is because the phase change of the memory phase-change layer pattern 84 is completed, thereby showing an electrical characteristic of a conductor. The resetting region 120 has a lower limit value I2 and an upper limit value I3 of current enough to write data '1' in the memory switching pattern 93. The setting region 130 has a lower limit value I1 and an upper limit value I2 of current enough to write data '0' in the memory switching pattern 93. Further, the memory switching pattern 93 does not show the electrical characteristics following along the current trajectory lines 143, 146, 149 after the phase change of the memory phase-change layer pattern 84. Instead, under the lower limit value I1 of the setting region 130, the memory switching pattern 93 shows another different current trajectory line 140. While the memory phase-change layer pattern 84 maintains its crystalline state, the memory switching pattern 93 has the electrical characteristic following along the two current trajectory lines 140, 149.

Next, there will be examined a current characteristic of the gate switching pattern 63 by using the current-voltage graph. In the current-voltage graph, a voltage is applied to the gate switching pattern 63. The gate switching pattern 63 shows an amorphous state having a high resistance depicted as a current trajectory line 150 until reaching a specific voltage V2 in the graph. Then, the gate switching pattern 63 causes the gate phase-change layer pattern 54 to make a phase change from an amorphous state to a crystalline state by using Joule heat of current at the specific voltage V2. Since the gate switching pattern 63 and the memory switching pattern 93 use different phase-change layers, respectively, a voltage value causing the gate phase-change layer pattern 54 to start its phase change is also different from the case of the memory switching pattern 93. The gate switching pattern 63 shows different current trajectory lines 154, 158 in the graph because of a decrease of inner resistances through the phase change of the gate phase-change layer pattern 54. The current trajectory line 154 shows a change of current upward to a lower limit value I1 of a setting region 130 with the start of the phase change of the gate phase-change layer pattern 54. The other current trajectory line 158 vertically traverses the resetting and setting regions 120, 130 with nearly little change of currents above the lower limit value I1 of the setting region 130, which is because the phase change of the gate phase-change layer pattern 54 is completed, thereby showing an electrical characteristic of a conductor. Further, the gate switching pattern 63 shows the electrical characteristic following along the current trajectory lines 150, 154, 158 after the phase change of the gate phase-change layer pattern 54, according to the reduction of the voltage.

In the event that the gate switching pattern 63 and the memory switching pattern 93 are electrically connected together to form the PRAM, the PRAM shows two different electrical characteristics depending on the crystalline state of the memory phase-change layer pattern 84. When the gate and the memory phase-change layer patterns 54, 84 are in an amorphous and a crystalline states, respectively, the PRAM shows a current trajectory line 160 reaching the lower limit value I1 of the setting region 130 as depicted in the graph. As such, the voltage applied through the upper electrode layer pattern 110 is focused to cause the Joule heat for phase change in the gate phase-change layer pattern 54. At this time, the PRAM can cause the gate phase-change layer pattern 54 to make the phase change from V3. On the contrary, above the lower limit value I1 of the setting region 130, the PRAM shows another different current trajectory line 165 passing nearly vertically through the resetting and the setting regions 120, 130. This is because the gate and the memory phase-change layer patterns 54, 84 are completely phase-changed to a crystalline state.

In the event the gate and the memory phase-change layer patterns 54, 84 are in an amorphous state, the PRAM shows a current trajectory line 170 in the graph showing that a voltage applied through the upper electrode layer pattern 110 is spread to the gate and the memory phase-change layer patterns 54, 84, and is focused to cause Joule heat. The PRAM starts to change phases of the gate and the memory phase-change layer patterns 54, 84 to a crystalline state at a specific voltage V4. The phase-change reduces the inner resistance of the gate and the memory phase-change layer patterns 54, 84. Therefore, the PRAM shows a current trajectory line 174 reaching from the specific voltage V4 to the lower limit value I1 of the setting region 130 in the graph. When the current trajectory line 174 reaches the lower limit value I1 of the setting region 130, the gate and the memory phase-change layer patterns 54, 84 are completely changed to a crystalline state. As such, the PRAM shows a current trajectory line 178 passing nearly vertically through the resetting and the setting regions 120, 130.

As described above, embodiments of the invention enable the replacement of a conventional CMOS transistor with a diode based on a phase-change of a gate phase-change layer pattern. Accordingly, embodiments of the invention enable high integration and high speed of a PRAM through the simplification of semiconductor fabrication processes.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A non-volatile memory cell, comprising:
   a semiconductor substrate;
   a phase-changeable diode comprising a first phase-changeable material on said semiconductor substrate; and
   a phase-changeable memory element comprising a second phase-changeable material that is more easily converted from an amorphous state to a crystalline state relative to the first phase-changeable material when the first and second phase-changeable materials are simultaneously undergoing Joule heating during a memory write operation, said phase-changeable memory element having a first terminal electrically coupled to a terminal of said phase-changeable diode.

2. The memory cell of claim 1, wherein said phase-changeable diode comprises:
   a lower electrode pattern on said semiconductor substrate; and
   a first phase-changeable pattern comprising the first phase-changeable material on said lower electrode pattern.

3. The memory cell of claim 2, wherein said phase-changeable diode further comprises a gate switching layer pattern on said first phase-changeable pattern.

4. The memory cell of claim 3, wherein said lower electrode pattern comprises a material selected from the group consisting of titanium nitride and tungsten; and wherein said gate switching layer pattern comprises titanium nitride.

5. The memory cell of claim 1, wherein said phase-changeable memory element comprises:
   a second phase-changeable pattern electrically coupled to the terminal of said phase-changeable diode, said second-phase changeable pattern comprising the second phase-changeable material.

6. The memory cell of claim 5, wherein said phase-changeable memory element further comprises a memory switching layer pattern on said second phase-changeable pattern, said memory switching layer pattern comprising a composite of a titanium layer pattern contacting said phase-changeable memory element and a titanium nitride layer pattern contacting said titanium layer pattern.

7. The memory cell of claim 2, wherein said first phase-changeable pattern comprises a material selected from the group consisting of $Ge_xAs_yTe_z$ and $Al_xAs_yTe_z$.

8. The memory cell of claim 7, wherein the second phase-changeable material is $Ge_xSb_yTe_z$.

9. The memory cell of claim 8, wherein said phase-changeable memory element further comprises a memory switching layer pattern on said second phase-changeable pattern, said memory switching layer pattern comprising a composite of a titanium layer pattern contacting said phase-changeable memory element and a titanium nitride layer pattern contacting said titanium layer pattern.

10. A phase-changeable random access memory (PRAM) cell, comprising:
    a semiconductor substrate having a semiconductor active region therein;
    a phase-changeable diode comprising a first phase-changeable material layer electrically coupled to the semiconductor active region; and
    a phase-changeable memory element comprising a second phase-changeable material layer that is electrically coupled to the first phase-changeable material layer and is more easily converted from an amorphous state to a crystalline state relative to the first phase-changeable material layer when the first and second phase-changeable material layers are simultaneously undergoing Joule heating by passing current in series through the first and second phase-changeable material layers during a memory write operation.

11. The PRAM cell of claim 10, wherein the first phase-changeable material layer comprises a material selected from a group consisting of $Ge_xAs_yTe_z$ and $Al_xAs_yTe_z$; and wherein the second phase-changeable material layer comprises $Ge_xSb_yTe_z$.

12. The PRAM cell of claim 10, further comprising a titanium nitride landing pad electrically connecting said phase-changeable diode to said phase-changeable memory element.

* * * * *